United States Patent
Norling et al.

(10) Patent No.: US 10,868,529 B2
(45) Date of Patent: Dec. 15, 2020

(54) SYSTEM AND METHOD FOR AN OVERPOWER DETECTOR

(71) Applicant: Infineon Technologies Austria AG, Villach (AT)

(72) Inventors: Karl Norling, Villach (AT); Erwin Huber, Munich (DE)

(73) Assignee: Infineon Technologies Austria AG, Villach (AT)

( * ) Notice: Subject to any disclaimer, the term of this patent is extended or adjusted under 35 U.S.C. 154(b) by 123 days.

(21) Appl. No.: 15/282,649

(22) Filed: Sep. 30, 2016

(65) Prior Publication Data

US 2018/0097515 A1   Apr. 5, 2018

(51) Int. Cl.
*H03K 17/082*   (2006.01)
*H03K 17/08*   (2006.01)
*H03K 17/0812*   (2006.01)

(52) U.S. Cl.
CPC ..... *H03K 17/0826* (2013.01); *H03K 17/0822* (2013.01); *H03K 17/0828* (2013.01); *H03K 17/08122* (2013.01); *H03K 17/08126* (2013.01); *H03K 17/08128* (2013.01); *H03K 2017/0806* (2013.01)

(58) Field of Classification Search
CPC ..................................... H02H 3/085
See application file for complete search history.

(56) References Cited

U.S. PATENT DOCUMENTS

| | | | | |
|---|---|---|---|---|
| 4,937,697 A * | 6/1990 | Edwards | ............... | H02H 5/044 |
| | | | | 323/276 |
| 9,800,176 B2 * | 10/2017 | Ding | ..................... | H02M 7/537 |
| 2013/0257177 A1 * | 10/2013 | Jacobson | ................ | H02M 1/08 |
| | | | | 307/115 |
| 2014/0084827 A1 * | 3/2014 | Schwarz | ............ | H03K 17/0828 |
| | | | | 318/400.21 |
| 2015/0236592 A1 * | 8/2015 | Inoue | .................... | H02M 3/158 |
| | | | | 318/445 |
| 2016/0124037 A1 * | 5/2016 | Zhang | ................ | G01R 31/3275 |
| | | | | 324/762.08 |

FOREIGN PATENT DOCUMENTS

| | | | |
|---|---|---|---|
| CN | 103701310 A | 4/2014 | |
| CN | 204145831 U | 2/2015 | |
| CN | 104852645 A | 8/2015 | |
| CN | 105226975 A | 1/2016 | |
| EP | 3059842 A1 * | 8/2016 | ............. H02M 1/36 |

* cited by examiner

*Primary Examiner* — Jared Fureman
*Assistant Examiner* — Christopher J Clark
(74) *Attorney, Agent, or Firm* — Slater Matsil, LLP

(57) ABSTRACT

A system and method for an overcurrent detector includes a device. The device includes a threshold generation circuit, and an overpower determination circuit. The threshold generation circuit is configured to produce a threshold value based on an output of a temperature sensor proximate to a power transistor, and a maximum power dissipation in the power transistor. The overpower determination circuit is configured to determine an overpower state of the power transistor based on the threshold value and a switch voltage. The switch voltage is detected between a source and a drain or a collector and an emitter of the power transistor.

15 Claims, 9 Drawing Sheets

SYSTEM AND METHOD FOR AN OVERPOWER DETECTOR

TECHNICAL FIELD

The present invention relates generally to gate drivers, and, in particular embodiments, to a system and method for an overcurrent state detector.

BACKGROUND

Generally, inverters for power generators, motors, power supplies, and the like use high voltage power semiconductor switches. Power generators and supplies may include devices such as solar panels, wind turbines, and uninterruptible power supplies (UPSs). Power semiconductor switches may include devices such as bipolar junction transistors (BJTs), metal-oxide-semiconductor field-effect transistors (MOSFETs), insulated-gate bipolar transistors (IGBTs), and the like. These power switches may experience an overload condition, such as an overcurrent, overvoltage, or overtemperature condition.

Detecting overcurrent conditions allows low-voltage devices, such as integrated circuit (IC) devices, to protect a power switch from the overcurrent conditions. One technique for detecting overcurrent conditions involves directly measuring the output current of the switching network, such as with a half-bridge. Another technique for detecting overcurrent conditions involves implementing fast desaturation or saturation detection in the switch. During a current overload, the collector-emitter voltage $V_{CE}$ of a BJT or IGBT may increase rapidly while the switch exits saturation. A BJT or IGBT exiting saturation may sometimes be referred to as being in "desaturation." Likewise, the drain-source voltage $V_{DS}$ of a MOSFET may increase rapidly while the switch exits the linear region of operation. A MOSFET exiting the linear region may sometimes be referred to as being in "saturation." Measuring $V_{CE}$ or $V_{DS}$ is an indirect and fast way to determine whether the switch has entered desaturation and a current overload. However, semiconductor switches for power generators and supplies may operate at high voltages, and so $V_{CE}$ or $V_{DS}$ may be too large to directly measure with an IC.

SUMMARY

In accordance with a preferred embodiment of the present invention, a device includes a threshold generation circuit, and an overpower determination circuit. The threshold generation circuit is configured to produce a threshold value based on an output of a temperature sensor proximate to a power transistor, and a maximum power dissipation in the power transistor. The overpower determination circuit is configured to determine an overpower state of the power transistor based on the threshold value and a switch voltage. The switch voltage is detected between a source and a drain or a collector and an emitter of the power transistor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
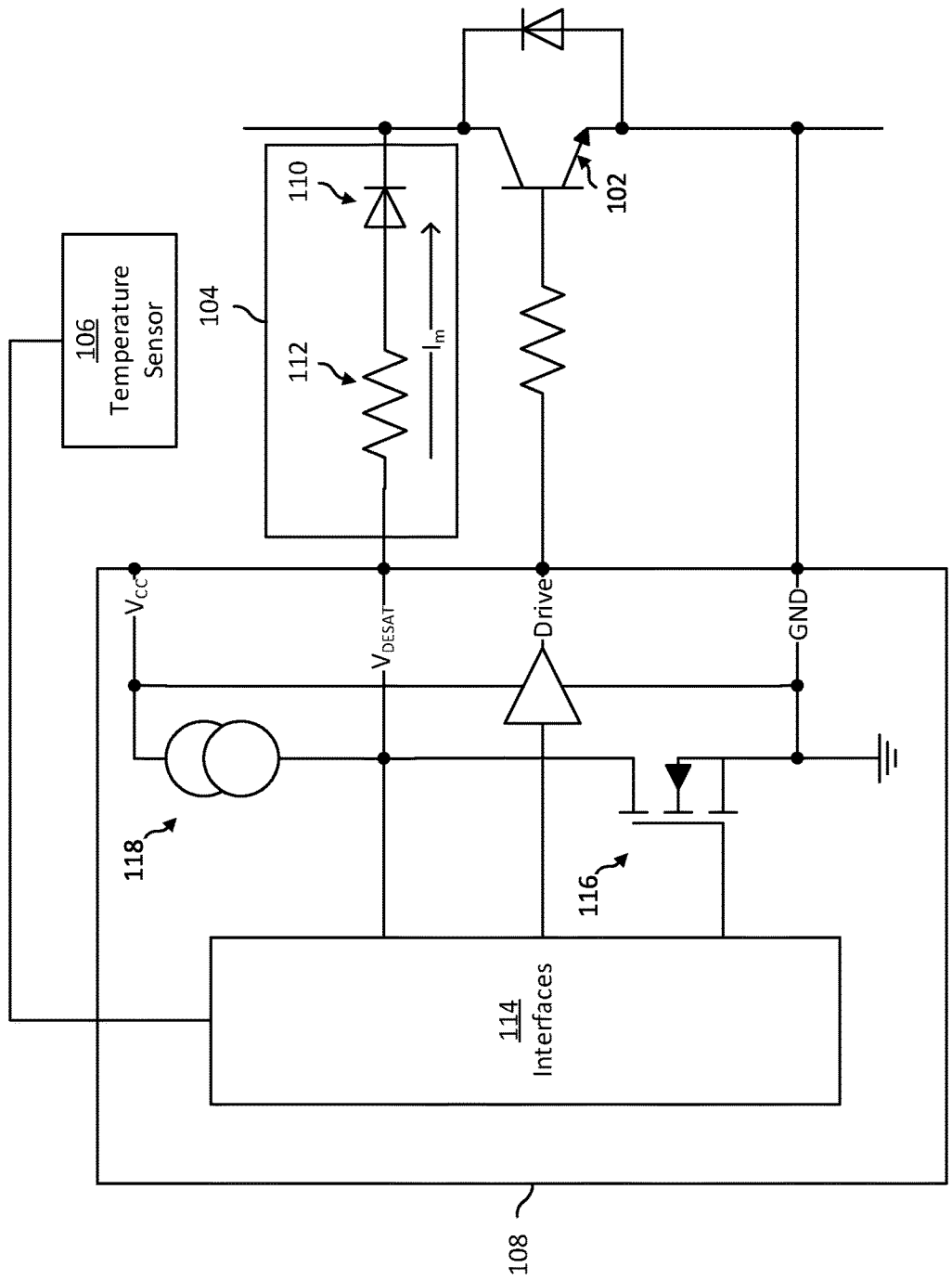
FIGS. 1A and 1B are circuit diagrams of desaturation detectors.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Techniques for limiting overpower conditions in a semiconductor power switch are provided in accordance with various embodiments. As used herein, the term (de)saturation, when used without reference to any particular type of switch, refers to either a bipolar transistor (such as a BJT or IGBT) being in desaturation or a field-effect transistor (such as a MOSFET) being in saturation. Overpower conditions of a power switch may be detected by determining, among other parameters, an overcurrent condition in the power switch. In particular, an IC is configured to indirectly measure the collector-emitter voltage $V_{CE}$ or the drain-source voltage $V_{DS}$ of a power switch. The collector-emitter voltage $V_{CE}$ or the drain-source voltage $V_{DS}$ of the power switch is indirectly measured because it may undergo large voltage swings, such as up to about 1000 V. The ratio of the collector-emitter voltage $V_{CE}$ to the collector current $I_C$ of an IGBT drifts with the temperature of the junction. This drift may lead to inaccurate (de)saturation detection, causing false positives and resulting in inverter instability. Further, inaccurate (de)saturation detection may cause false negatives, resulting in the IGBT remaining on during an overcurrent state, which may destroy the IGBT through electrical overstress, or lower the reliability of the IGBT. This drift may increase the failure rate of switches, lowering reliability due to electrical or thermal stresses. Various embodiments integrate temperature sensor(s) with a driver system for a semiconductor power switch, and vary a threshold of $V_{CE}$ or $V_{DS}$ that indicates switch (de)saturation (sometimes called the "(de)saturation threshold"). The (de)saturation threshold is varied according to the measured temperature.

Quickly turning off a semiconductor power switch when it is loaded or overloaded may cause damage to the switch and/or result in unexpected circuit operation. Soft switching, e.g., gradual switching, may allow a semiconductor power switch to be shut off when under partial or full loads. Hard or abrupt switching may only be safe under certain loads. For example, some switches may be damaged or operate incorrectly if they are abruptly switched when the collector current is more than two times a nominal amount. Due to series inductances that may be coupled to the switch, energies may build up and cause an overvoltage of the switch when the switch is turned off.

Some types of switches, such as silicon carbide (SiC) MOSFETs, may have smaller saturation detection thresholds that drift more with temperature. For example, some IGBTs may have a desaturation detection threshold around 9 V, but some SiC MOSFETs may have saturation detection thresholds that are less than 2 V. Devices with lower (de)saturation detection thresholds may be more severely affected by disturbances in the supply voltage and/or output current, and may thus more quickly enter operating regions where an abrupt switch off is unsafe. Additionally, temperature coefficients of lower-threshold devices are similar to higher-threshold devices. As a result, lower-threshold devices may be more severely affected by changes in temperature. In some embodiments, the (de)saturation threshold may be compensated after it is adjusted for temperature variations. Adjusting the (de)saturation threshold to maintain a particular operating condition may keep the short circuit losses in a switch constant. Overcompensating the (de)saturation threshold for higher temperatures may further reduce the short circuit losses at those temperatures, and prevent the switch from exceeding operating conditions by an amount that makes hard switching unsafe. This may reduce the maximum temperatures the switch junction experiences, lowering stresses in the device.

Although the illustrated embodiments are presented in the context of adjusting the desaturations thresholds of BJTs or IGBT according to temperature sensors, it should be appreciated that techniques presented herein could be applied with other power switches. For example, voltages across the terminals of MOSFETs could also be measured and a saturation threshold of the MOSFETs could be adjusted. Further, more than one environmental sensor and/or type of environmental sensor could be used.

FIG. 1A is a circuit diagram of a desaturation detector system 100, which may be part of a power inverter, according to an embodiment. The desaturation detector system 100 includes a power switch 102, a detector interface circuit 104, a temperature sensor 106, and a gate driver 108.

The power switch 102 is a semiconductor power switch, such as a BJT, IGBT, or MOSFET. When the power switch 102 is a BJT or IGBT, the collector-emitter voltage $V_{CE}$ of the power switch 102 may increase during an overload condition as the power switch 102 enters desaturation. When the power switch 102 is a MOSFET, the drain-source voltage $V_{DS}$ of the power switch 102 may increase during an overload condition as the power switch 102 enters saturation. In embodiments where the power switch 102 is a MOSFET, the power switch 102 may be a SiC MOSFET. The collector-emitter voltage $V_{CE}$ of the power switch 102 may have a voltage swing of up to about 1000 V.

The detector interface circuit 104 is coupled to the power switch 102 and indirectly measures the collector-emitter voltage $V_{CE}$ or the drain-source voltage $V_{DS}$ of the power switch 102. The detector interface circuit 104 includes a high voltage diode 110 and a protection resistor 112 in series, and is coupled to the collector or drain of the power switch 102. The high voltage diode 110 has a voltage drop $V_D$ across in the forward direction. The protection resistor 112 has a resistance $R_{prot}$. In some embodiments, the resistance $R_{prot}$ is about 1 kΩ. Although FIG. 1A shows the cathode of the high voltage diode 110 coupled to the power switch 102, it should be appreciated that the high voltage diode 110 and the protection resistor 112 may be swapped such that the protection resistor 112 is coupled to the power switch 102, and the anode of the high voltage diode 110 is coupled to the gate driver 108.

The temperature sensor 106 measures various temperatures in the desaturation detector system 100 so that the desaturation threshold may be adjusted. As discussed below, the temperature sensor 106 could measure the temperatures of one or several devices in the desaturation detector system 100, and may measure ambient temperatures or device junction temperatures.

The gate driver 108 produces a high-current and/or high-voltage drive output, which is provided to the gate of the power switch 102. The drive output may be a larger signal produced from a logic-level signal, such as the output of a microcontroller. For example, the drive output produced may have a voltage of up to about +/−15 V and a current of up to about 10 A. In some embodiments, the gate driver 108 is an application-specific integrated circuit (ASIC) that includes a level shifter or an isolation circuit, and an amplifier (not shown). In such embodiments, the gate driver 108 may produce the higher level drive signal from a low-power signal. The gate driver 108 has terminals for a source voltage $V_{CC}$, a desaturation detection voltage $V_{DESAT}$, and grounding, and includes measurement interfaces 114, a protection MOSFET 116, and a current source 118. In some embodiments, the gate driver 108 may also include a filter (not shown) between the desaturation detection voltage $V_{DESAT}$ terminal and GND, which may be used to prevent noise and spikes from causing desaturation detection false positives. The filter may include a capacitor.

The measurement interfaces 114 include a comparator and a sensor interface (not shown). The detector interface circuit 104 is coupled to the comparator, and the temperature sensor 106 is coupled to the sensor interface. When the power switch 102 is on, the comparator compares $V_{CE}$ or $V_{DS}$ to a desaturation threshold to determine whether the power switch 102 is in desaturation. The measurement interfaces 114 interface the temperature sensor 106 with the gate driver 108 and other devices.

The protection MOSFET 116 is between the desaturation detection voltage $V_{DESAT}$ terminal of the gate driver 108 and the ground, and protects the measurement interfaces 114. The protection MOSFET 116 is enabled (e.g., the gate is driven to the active region) when the drive output for the power switch 102 is disabled, clamping the detection voltage $V_{DESAT}$ terminal to GND. Enabling the protection MOSFET 116 may prevent any voltages present at the collector or drain of the power switch 102 from being transferred through the high voltage diode 110 and the protection resistor 112 to the detection voltage $V_{DESAT}$ terminal. By enabling the protection MOSFET 116 when the power switch 102 is disabled (e.g., after desaturation detection), the gate driver 108 may also be protected from surges.

The current source 118 is powered by the source voltage $V_{CC}$ and forces a biasing current $I_m$ to flow from the desaturation detection voltage $V_{DESAT}$ terminal, through the protection resistor 112 and the high voltage diode 110, and to the collector or drain of the power switch 102. The biasing current $I_m$ may be provided when the power switch 102 is switched on and the voltage at the collector or drain of the power switch 102 is measured. The high voltage diode 110 protects the gate driver 108 from a potentially high voltage at the collector or drain of the power switch 102 when the biasing current $I_m$ is provided. Driving the biasing current $I_m$ causes a voltage drop across the high voltage diode 110, protecting the gate driver 108 from the high voltages. The voltage drop $V_D$ across the high voltage diode 110 can be related to the collector-emitter voltage $V_{CE}$ of the power switch 102 according to:

$$V_{DESAT} = I_m * R_{prot} + V_D + V_{CE}. \qquad (1)$$

Because the biasing current $I_m$, the resistance $R_{prot}$, and the voltage drop $V_D$ are known values, the gate driver 108 measures the desaturation detection voltage $V_{DESAT}$ and calculates the collector-emitter voltage $V_{CE}$. The collector-emitter voltage $V_{CE}$ may then be compared to a desaturation threshold generated with a threshold generation circuit (discussed below).

The behavior of various components in the desaturation detector system 100 may drift at higher temperatures, affecting some of the variables in Equation (1). For example, the current source 118 may not accurately produce the biasing current $I_m$ and the gate driver 108 may not accurately measure the desaturation detection voltage $V_{DESAT}$ at higher temperatures. The high voltage diode 110 and the semiconductor power switch 102 also behave differently at higher temperatures.

The voltage drop $V_D$ of the high voltage diode 110 decreases as temperature increases, decreasing the desaturation detection voltage $V_{DESAT}$ measured by the gate driver 108 for a given collector-emitter voltage $V_{CE}$. The desaturation threshold may be decreased to compensate for the decreased voltage drop $V_D$. The temperature coefficient of the voltage drop $V_D$ varies depending on the type of diode used, and may be between about –1 mV/° C. and about –7 mV/° C. In some embodiments, more than one high voltage diode 110 may be used by placing them in series. In such embodiments, the temperature coefficient is multiplied by the number of diodes used. The high voltage diode 110 may not heat as a result of operation, but is affected by the ambient temperature near the power switch 102.

The collector-emitter voltage $V_{CE}$ of the power switch 102 increases with temperature for a given load. A higher desaturation threshold may be needed to compensate for the increase in the collector-emitter voltage $V_{CE}$. The temperature coefficient varies depending on the type of semiconductor switch used. The power switch 102 heats as a result of operation, and is further affected by the ambient temperature near the power switch 102. Additionally, the driver junction of the power switch 102 heats as switching frequency increases.

The desaturation threshold may be adjusted according to the temperature coefficients and changes in the temperatures of various components in the desaturation detector system 100. In some embodiments, the temperatures and temperature coefficients of the high voltage diode 110, the protection resistor 112, and the power switch 102 are taken in to consideration when adjusting the desaturation threshold. In other words, the desaturation threshold $V_{TH}$ may be determined based on the behavior of the system as a whole, and not the temperature of any particular component considered in isolation. For example, the constellation of devices and the distribution of temperatures in the desaturation detector system 100 may be considered when determining the desaturation threshold. The desaturation threshold may be determined according to:

$$V_{TH} = I_m * R_{prot} + [V_D + TC_D * T_D] + [V_{CE,SAT} + TC_{SAT} * T_{SWITCH}], \quad (2)$$

where $TC_D$ is the temperature coefficient of the forward voltage of the high voltage diode 110, $T_D$ is the temperature of the diode, $V_{CE,SAT}$ is the saturation voltage of the power switch 102, $TC_{SAT}$ is the temperature coefficient of the saturation voltage of the power switch 102, and $T_{SWITCH}$ is the temperature of the switch. In embodiments where more than one high voltage diode is used, the term $[V_D + TC_D * T_D]$ may be multiplied by the quantity of high voltage diodes.

Although not shown above, it should be appreciated that other components may also be compensated for. For example, if the current source has a significant temperature coefficient such that the biasing current $I_m$ varies, then the voltage drop $V_D$ of the high voltage diode 110 may also be adjusted. Further, other components may not be adjusted. For example, the protection resistor 112 may be a resistor with a low temperature coefficient that does not significantly vary with temperature.

The desaturation threshold $V_{TH}$ may be calculated such that it is exceeded under particular operating conditions of the components. In some embodiments, the desaturation threshold $V_{TH}$ such that it is exceeded when the power switch 102 exceeds a particular collector current $I_C$. In some embodiments, the desaturation threshold $V_{TH}$ is determined such that it is exceeded when the power dissipation in the power switch 102 exceeds a particular value. The desaturation threshold $V_{TH}$ may be selected such that any operating condition may be achieved. As noted above, the desaturation threshold $V_{TH}$ may be further compensated. For example, the desaturation threshold $V_{TH}$ may be determined so that it is exceeded at lower current or power dissipation in the power switch 102. The lower current or power dissipation may be achieved when the components are at a higher temperature than a predetermined temperature (such as a room temperature).

In some embodiments, the desaturation threshold may be estimated by determining a temperature coefficient of the system and measuring a temperature in the system. The temperature coefficient of the system may be calculated by summing the temperature coefficients of the components in the system. The temperature may be, e.g., an ambient temperature. For example, an adjustment to the desaturation threshold may be computed according to:

$$TC_{system} * (T_{measured} - T_{offset}), \quad (3)$$

where $TC_{system}$ is the temperature coefficient of the system, $T_{measured}$ is a measured temperature, and $T_{offset}$ is an offset temperature that is a fictive temperature of the combined devices with the temperature coefficient of $TC_{system}$.

Figure 1B:
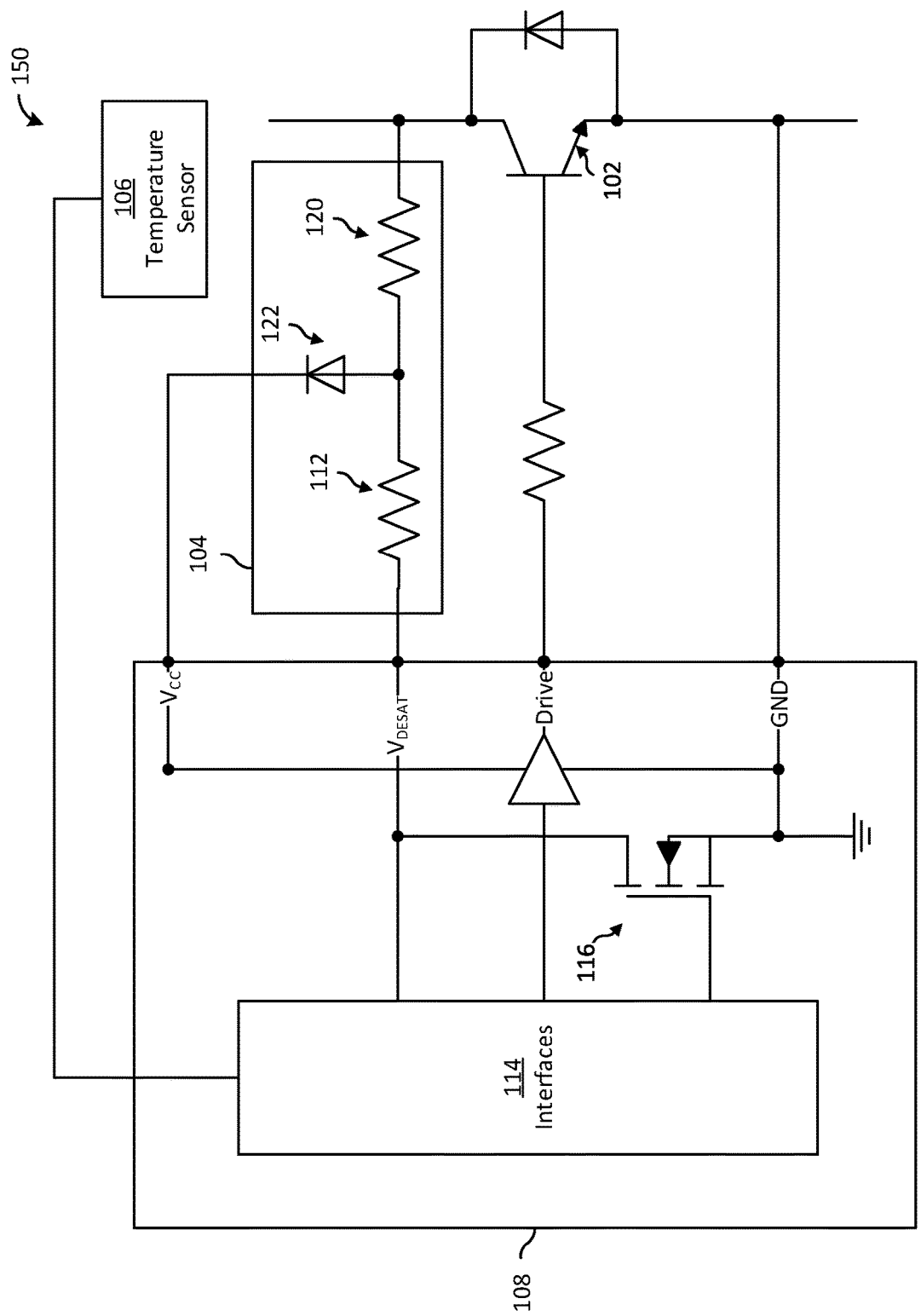

FIG. 1B is a circuit diagram of a desaturation detector system 150, which may be part of a power inverter, according to an embodiment. The desaturation detector system 150 is similar to the desaturation detector system 100, except the detector interface circuit 104 is configured differently. The different configuration of the detector interface circuit 104 provides an alternative technique for protecting the gate driver 108. In particular, the high voltage diode no is replaced with a resistor 120, a low voltage diode 122 is coupled to the power supply (e.g., the source voltage $V_{CC}$) of the gate driver 108, and the current source 118 is removed.

When the power switch 102 of the desaturation detector system 150 is in the off state, the protection MOSFET 116 is activated to clamp the input of the comparator in the measurement interfaces 114 to 0 V. At the same time, the collector-emitter voltage $V_{CE}$ of the power switch 102, depending on the direction of load current flow, may be at a slightly negative voltage potential, or may be at a high voltage potential, such as about 800 V. Depending on the ratio between the resistors 112 and 120 and the collector-emitter voltage $V_{CE}$, the low voltage diode 122 may be forward biased or reverse biased. The resistance of the resistors 112 and 120 may be high, so that the resistors 112 and 120 do not consume excessive power in the off state. If the collector-emitter voltage $V_{CE}$ was high in the off state, the collector-emitter voltage $V_{CE}$ will fall to the saturation voltage $V_{CE,SAT}$ when the power switch 102 is turned on. When (or slightly after) the power switch 102 is turned on, the protection MOSFET 116 is turned off to release the comparator input clamping.

The series resistance of the resistors 112 and 120 between the comparator input and the collector or the source of the power switch 102 may be high. Due to this high resistance, any capacitance or parasitic capacitance at the desaturation detection voltage $V_{DESAT}$ node may slow the reaction time of desaturation detection. It may also filter out disturbances. When desaturation occurs, the collector-emitter voltage $V_{CE}$ increases to a level higher than the threshold of the comparator, and the power switch 102 is disabled.

During desaturation, the collector-emitter voltage $V_{CE}$ voltage may exceed the supply voltage of the gate driver 108 (e.g., the source voltage $V_{CC}$). If this occurs, the low voltage diode 122 and the resistor 120 may protect the gate driver 108 form potentially destructive voltage levels at the collector of the power switch 102. The low voltage diode 122 clamps the node between resistor 112 and 120 to a voltage that is the sum of the source voltage $V_{CC}$ and the forward threshold voltage of the low voltage diode 122. Current will flow from the collector of the power switch 102 through the resistor 120 and the low voltage diode 122.

Figure 2:
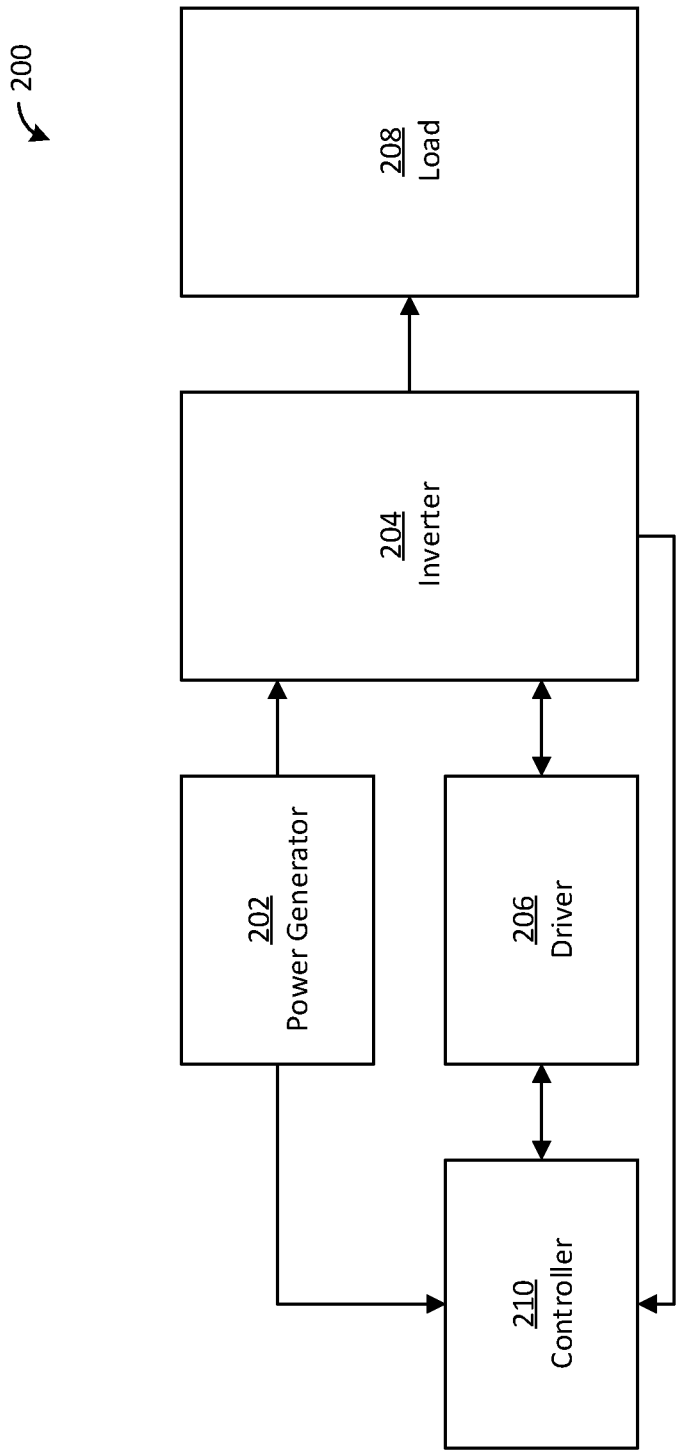
FIG. 2 is a block diagram of a power system.

FIG. 2 is a block diagram of a power system 200. The power system 200 includes a power generator 202, an inverter 204, driver 206, a load 208, and a controller 210. The power generator 202 is a device that produces a DC signal, such as a solar panel, mains plug, or wind turbine. Although shown as a single block, it should be appreciated that the power generator 202 may include many devices, such as multiple wind turbines in a wind farm. The inverter 204 receives the DC signal from the power generator 202 and produces an AC signal. In some embodiments, the inverter 204 may be a multi-branch device, such as a neutral point clamped (NPC) inverter. The driver 206 produces a drive output that is provided to the gates of power switches in the inverter 204. The load 208 is powered by the AC signal, and may be indicative of a larger electrical distribution grid. The controller 210 controls the driver 206 according to feedback received from the power generator 202, the inverter 204, and the driver 206.

According to various embodiments, the driver 206 senses desaturation of power switches in the inverter 204 and may turn off the inverter 204 and/or notify other systems of the failure. In the embodiment shown in FIG. 2, the driver 206 notifies the controller 210 of inverter failure, but other operators or systems may be notified. The driver 206 evaluates various temperatures, such as the temperatures of devices in the driver 206 and/or the inverter 204, or ambient temperatures, and adjusts the desaturation threshold for the inverter 204 according to the temperatures.

Figure 3:
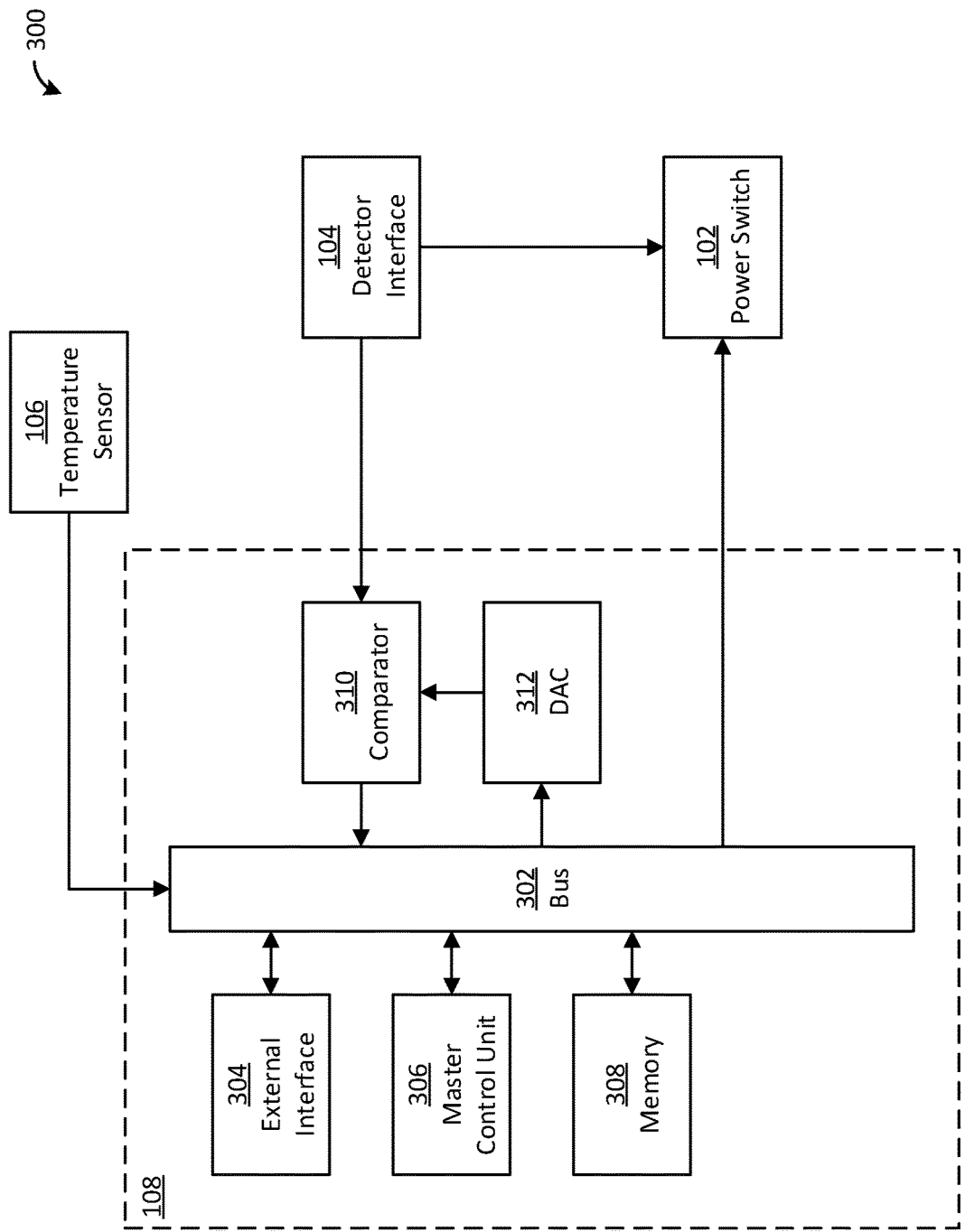
FIGS. 3-7 are block diagrams of desaturation detection systems.

FIG. 3 is a block diagram of a desaturation detection system 300. The desaturation detection system 300 includes the power switch 102, the detector interface circuit 104, the temperature sensor 106, and the gate driver 108. Although the different devices in the desaturation detection system 300 are illustrated as separate blocks, it should be appreciated that some of them may be formed on a same microfabricated die, and some or all of them may be located on the same substrate. Further, in some embodiments, the devices in the desaturation detection system 300 are covered by a heat sink (not shown).

The temperature sensor 106 is exposed to the ambient environment. As such, the temperature sensor 106 measures the global ambient temperature of the desaturation detection system 300, which is affected by multiple devices in the desaturation detection system 300. In some embodiments, the temperature sensor 106 measures the ambient temperature of an inverter that the desaturation detection system 300 is part of.

The gate driver 108 includes a bus 302, an external interface 304, a master control unit 306, memory 308, a comparator 310, and a digital-to-analog converter (DAC) 312. Devices in the gate driver 108 may (or may not) be interconnected on the bus 302. The external interface 304 is connected to the bus 302 and provides a digital interface for outside devices to interact with the desaturation detection system 300. For example, the external interface 304 may send a notification to a system that the desaturation detection system 300 is integrated with that indicates an overcurrent state or device failure. The external interface 304 may communicate with, e.g., a microcontroller, microprocessor, digital signal processor (DSP), field programmable gate array (FPGA), digital logic device, application-specific integrated circuit (ASIC) or the like.

The master control unit 306 controls the gate driver 108. It includes function units and/or circuitry for performing start-up sequences, controlling power modes, optimizing, and testing the gate driver 108. The master control unit 306 may include a control state machine, which interfaces with the comparator 310 and controls the power switch 102. According to embodiments, the master control unit 306 controls the sensitivity of overcurrent detection by adjusting the desaturation threshold according to values read from the temperature sensor 106. The master control unit 306 may be a microcontroller, microprocessor, DSP, digital logic device, ASIC or the like.

The memory 308 stores values used by the master control unit 306 or external systems. According to some embodiments, the memory 308 stores coefficients determined from the read temperature value(s). The coefficients are used by the master control unit 306 to adjust the desaturation threshold. The memory 308 may be volatile memory, e.g., random access memory (RAM), or may be non-volatile memory, e.g., flash memory.

The gate driver 108 also produces a high-current and/or high-voltage drive output, which is provided to the gate of the power switch 102. The gate driver 108 may further comprise a level shifter and an amplifier (not shown). Some components, such as the level shifter, may be exposed to the full source voltage of the power switch 102, which may be greater than or equal to about 1200 V in some embodiments. The level shifter and an amplifier may be part of, e.g., the external interface 304. In embodiments where the desaturation detection system 300 in the gate driver 108 is part of a power inverter, the drive output may be switched according to commands for the desired output waveform received by the master control unit 306 via the external interface 304. The gate driver 108 may produce the output signal with sine wave modulation, wherein the power switch 102 is switched at a higher rate than the output signal of the power inverter. For example, the power switch 102 may be switched at a rate of between about 4 kHz and about 20 kHz.

The comparator 310, sometimes called an overcurrent detector, compares the measured collector-emitter voltage $V_{CE}$ from the detector interface circuit 104 to a threshold value provided by the DAC 312. As discussed above, a high collector-emitter voltage $V_{CE}$ indicates that the power switch 102 is experiencing an overcurrent. When the collector-emitter voltage $V_{CE}$ exceeds the threshold, the comparator 310 outputs a signal indicating an overcurrent state. The master control unit 306 may then switch off the power switch 102. In some embodiments, the master control unit 306 notifies another system of the overcurrent via the external interface 304. It should be appreciated that in some embodiments, other overcurrent detectors may be used. The comparator 310 also includes the protection MOSFET 116, which may be turned on to clamp the comparator 310 to GND when the power switch 102 is switched off. The comparator 310 may also include sources to produce the biasing current $I_m$.

The DAC 312, sometimes called a threshold generation circuit, produces an analog signal indicating the desaturation threshold. A digital value for the desaturation threshold is determined by the master control unit 306. The master control unit 306 adjusts the value provided by the DAC 312 according to the coefficients in the memory 308. For example, the master control unit 306 may raise the threshold when the ambient temperature is high. In some embodiments, the master control unit 306 may compensate adjustments of the desaturation threshold, in order to prevent the power switch 102 from growing progressively warmer during operation. For example, the master control unit 306 may set temperature coefficients for the desaturation threshold to a value that is less than combined temperature coefficients of the power switch 102 and the high voltage diode 110. Compensating the desaturation threshold may avoid gradual degrading of the overcurrent capabilities of the power switch 102. It should be appreciated that in some embodiments, other threshold generation circuits may be used.

Although the desaturation detection system 300 shown in FIG. 3 is a digital system, it should be appreciated that other types of systems could be used to produce and adjust the desaturation threshold. For example, in some embodiments, the master control unit 306 may be an analog circuit that adjusts the desaturation threshold. In such embodiments, the system may not include the DAC 312 or the memory 308, and the devices may be coupled in a different manner. For example, there may be a direct analog connection between the master control unit 306 and the comparator 310.

Figure 4:
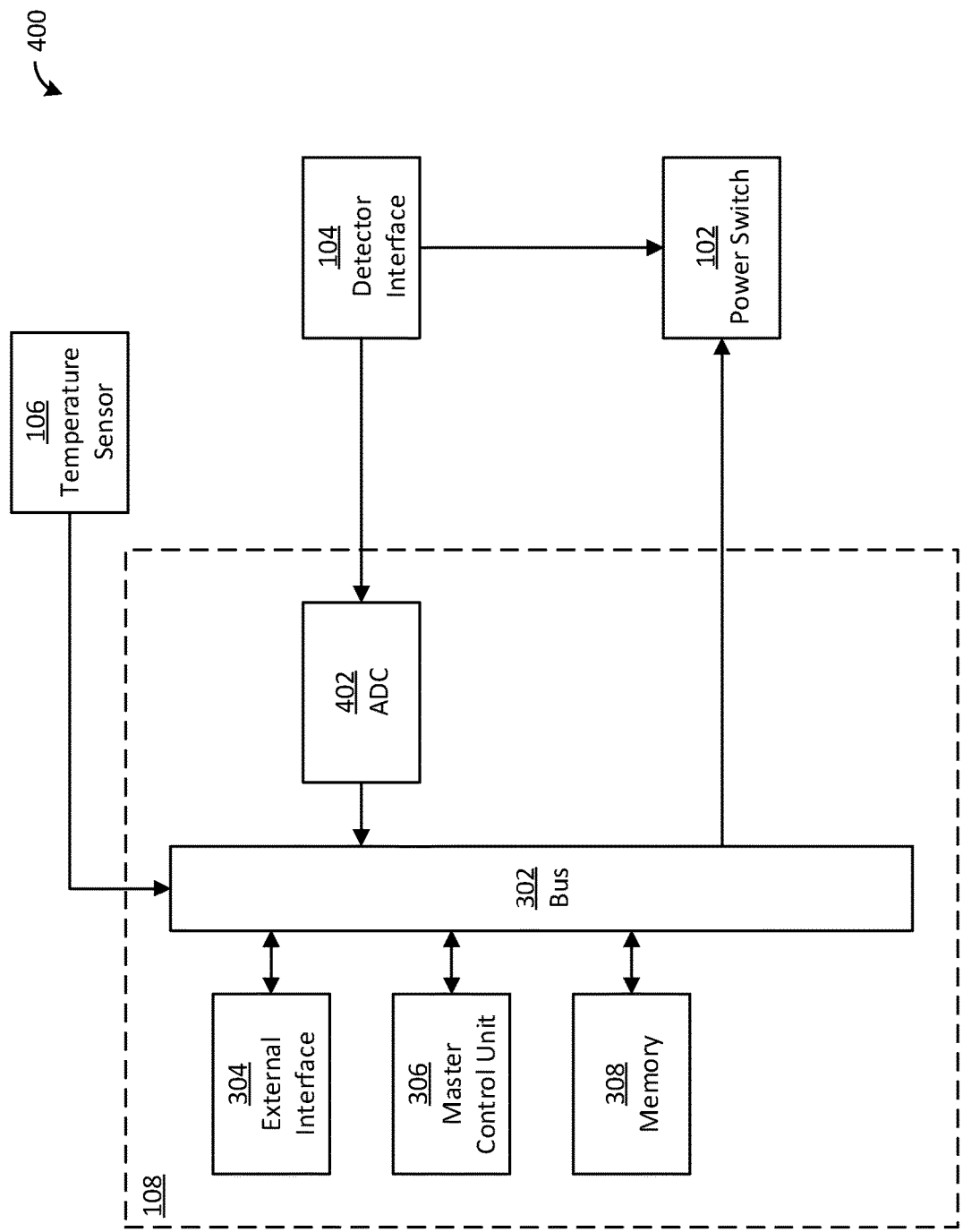

FIG. 4 is a block diagram of a desaturation detection system 400. The desaturation detection system 400 is similar to the desaturation detection system 300, except the comparator 310 and the DAC 312 are replaced with an analog-to-digital converter (ADC) 402. Instead of providing a reference signal to the comparator 310, the master control unit 306 samples the output of the detector interface circuit 104 with the ADC 402 to determine the collector-emitter voltage $V_{CE}$. The master control unit 306 then compares the sampled values to a desaturation threshold to determine whether the power switch 102 is in desaturation. As such, the combination of the master control unit 306 and the ADC 402 form the threshold generation circuit and the overcurrent detector.

Figure 5:
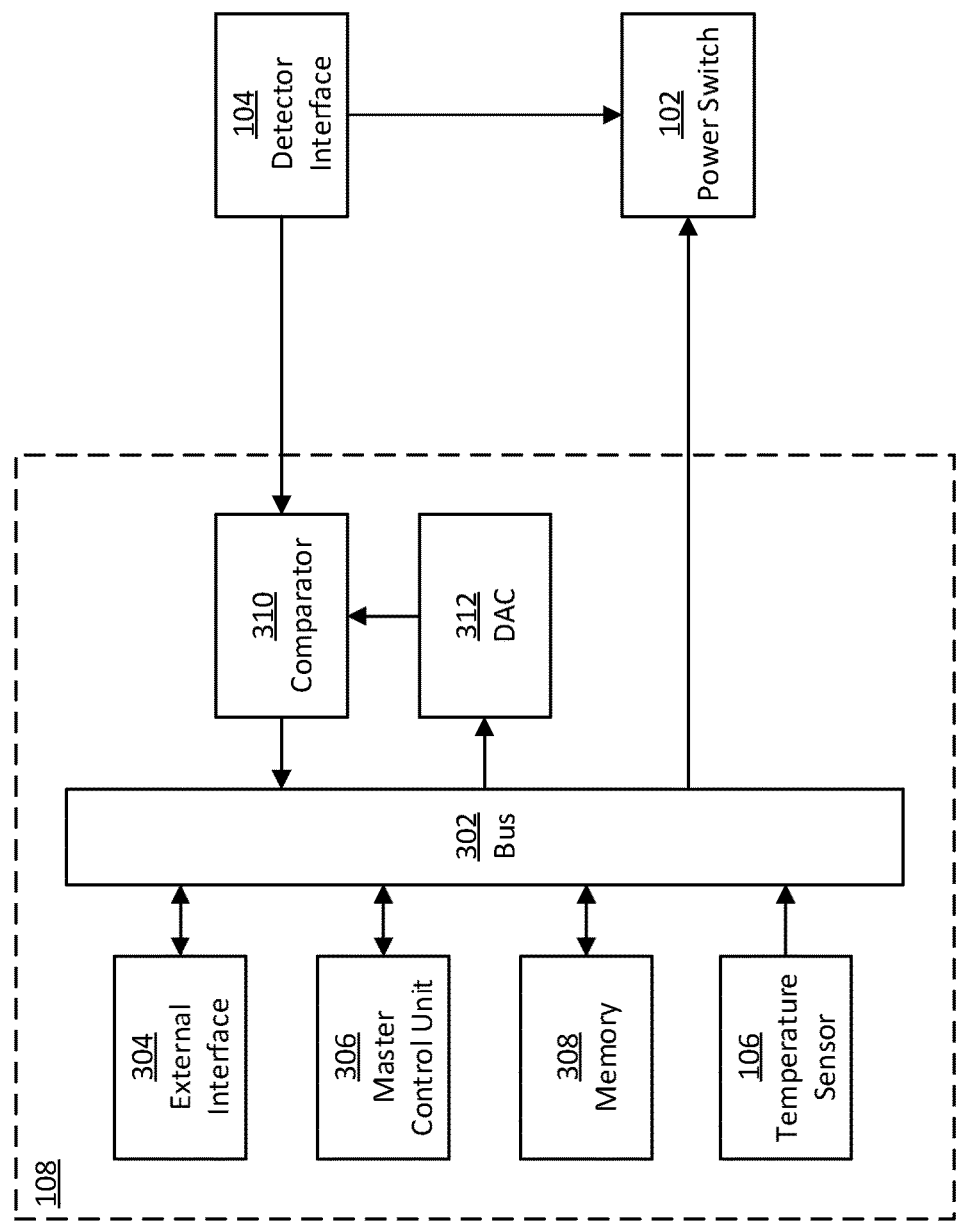

FIG. 5 is a block diagram of a desaturation detection system 500. The desaturation detection system 500 is similar to the desaturation detection system 300, except the temperature sensor 106 is located proximate to or in the gate driver 108. The temperature sensor 106 may measure the local ambient temperature near the gate driver 108, or may directly measure junction temperatures of devices in the gate driver 108. The master control unit 306 may increase the desaturation threshold provided to the comparator 310 when the ambient temperature in the gate driver 108 increases.

Figure 6:
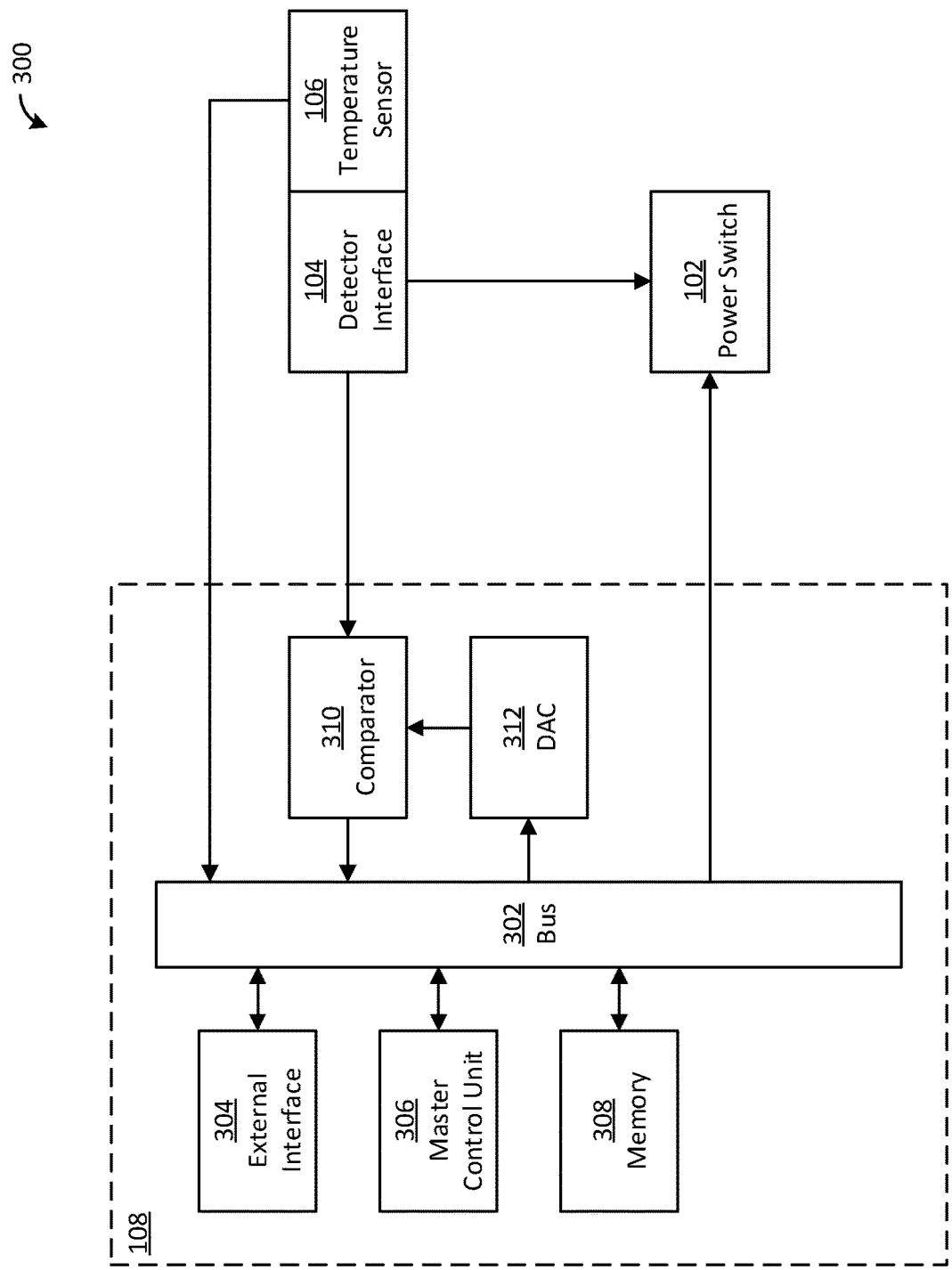

FIG. 6 is a block diagram of a desaturation detection system 600. The desaturation detection system 600 is similar to the desaturation detection system 300, except the temperature sensor 106 is located proximate to or in the detector interface circuit 104. The temperature sensor 106 may measure the local ambient temperature near the high voltage diode in the detector interface circuit 104, or may directly measure the junction temperature of the high voltage diode 110. The master control unit 306 may decrease the desaturation threshold provided to the comparator 310 when the temperature near or in the detector interface circuit 104 increases.

Figure 7:
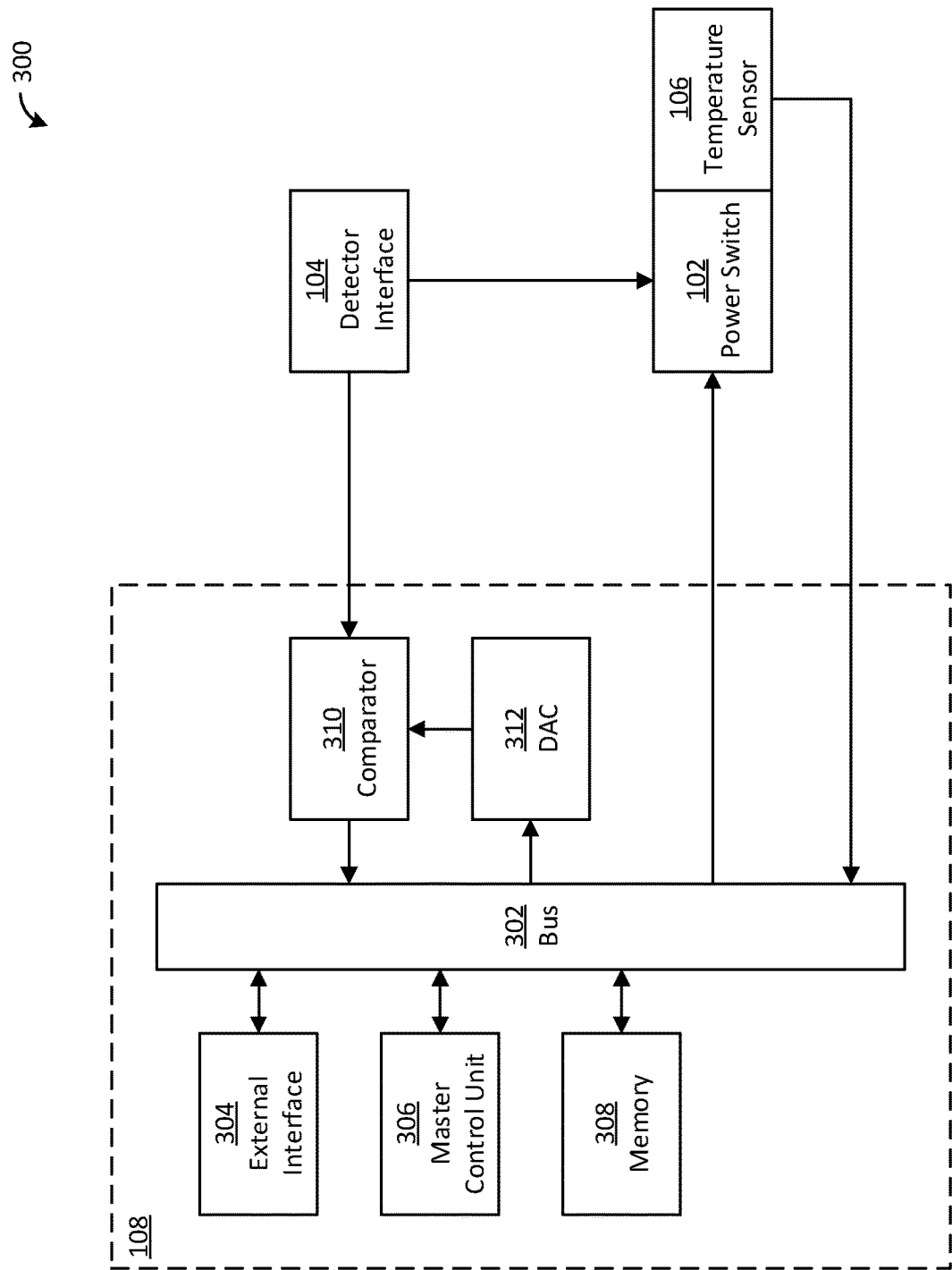

FIG. 7 is a block diagram of a desaturation detection system 700. The desaturation detection system 700 is similar to the desaturation detection system 300, except the temperature sensor 106 is located proximate to or in the power switch 102. The temperature sensor 106 may measure the local ambient temperature near the power switch 102, may directly measure a junction temperature of the power switch 102, or may measure the temperature of a base plate of the power switch 102. The master control unit 306 may increase the desaturation threshold provided to the comparator 310 when the temperature near or in the power switch 102 increases.

Figure 8:
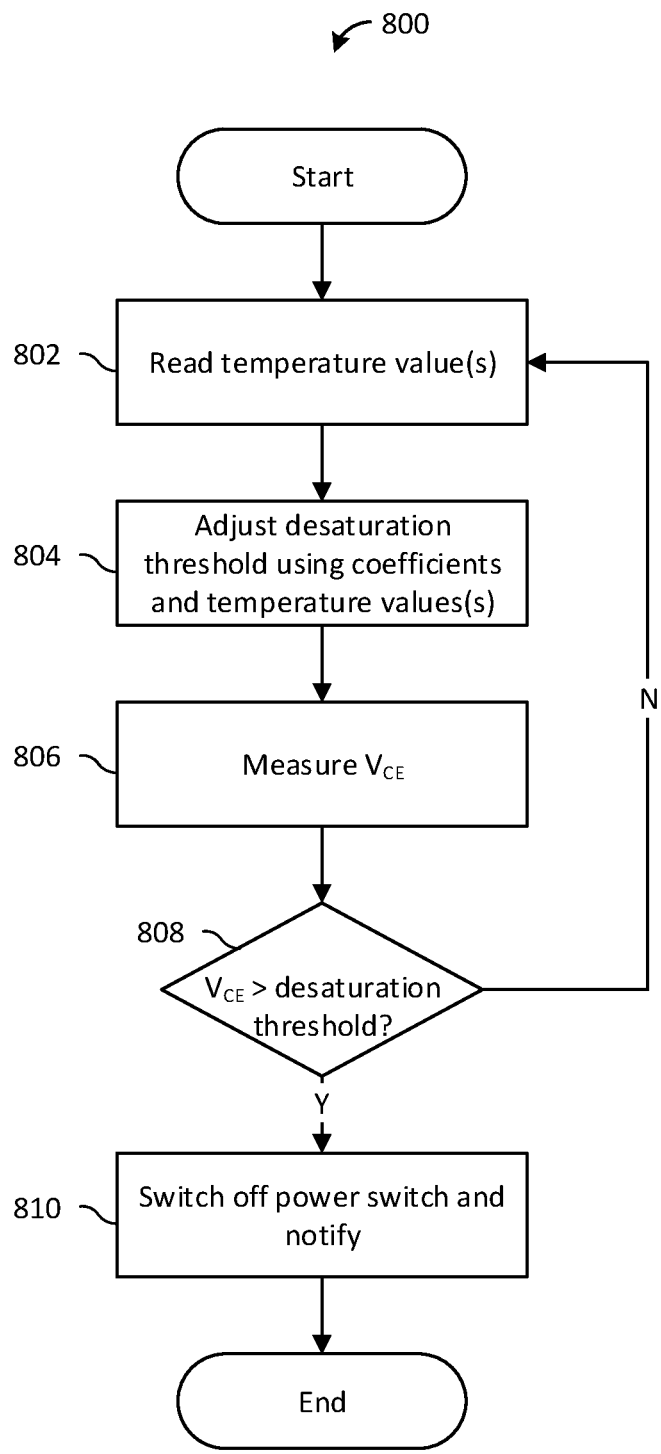
FIG. 8 is a flow diagram of a desaturation detection method.

FIG. 8 is a flow diagram of a desaturation detection method 800. The desaturation detection method 800 is indicative of operations occurring in a desaturation detection system. In some embodiments, the desaturation detection system only performs operations in the desaturation detection method 800 when the driver output is high, e.g., when the power switch is enabled.

Values(s) are read from one or more temperature sensors in the power system (step 802). The temperature sensors may measure ambient temperatures or specific device junction temperatures. The desaturation threshold is adjusted using a correction coefficient and the temperature value(s) (step 804). The correction coefficient may be a value stored in a lookup table. The desaturation threshold value may be computed with the correction coefficient according to:

$$V_{TH}=C_{TH}*T-0, \quad (3)$$

where $C_{TH}$ is the correction coefficient, T is one of the temperature value(s), and 0 is an offset value. In some embodiments, the desaturation threshold value may be more accurately computed with a higher order equation, such as an equation that uses two correction coefficients and considers second order effects. The new desaturation threshold value may be output to, e.g., a DAC. The collector-emitter voltage $V_{CE}$ of the power switch is measured using the desaturation detector and compared to the desaturation threshold (step 806). If the collector-emitter voltage $V_{CE}$ exceeds the desaturation threshold (step 808), then the power switch is in an overcurrent state. The power switch is switched off and an external system is optionally notified (step 810). If the collector-emitter voltage $V_{CE}$ does not exceed the desaturation threshold (step 808), then the desaturation detection method 800 repeats from step 802.

An advantage of a preferred embodiment of the present invention is decreased power switch size and increased reliability. Typically, use of larger semiconductor switches and conductors may increase overload robustness. Electrically protecting the switches from overcurrent states may preclude the need for larger switches, reducing device costs and size. Additionally, by increasing the accuracy of overcurrent detection, power switches with lower desaturation detection thresholds may be protected.

In accordance with a preferred embodiment of the present invention, a device includes a threshold generation circuit, and an overpower determination circuit. The threshold generation circuit is configured to produce a threshold value based on an output of a temperature sensor proximate to a power transistor, and a maximum power dissipation in the power transistor. The overpower determination circuit is configured to determine an overpower state of the power transistor based on the threshold value and a switch voltage.

The switch voltage is detected between a source and a drain or a collector and an emitter of the power transistor.

In some embodiments, the overpower determination circuit includes a comparator configured to compare the threshold value to the switch voltage. In some embodiments, the device further includes memory. The memory is configured to store coefficients relating the threshold value with the output of the temperature sensor, the threshold generation circuit further configured to adjust the threshold value based on the coefficients stored in the memory. In some embodiments, the overpower determination circuit includes a comparator configured to be coupled to a detector interface circuit, the comparator measuring the switch voltage, the detector interface circuit comprising a protection resistor and a diode, the protection resistor and the diode coupled in series, and further includes a current source. The current source is configured to provide a biasing current through the protection resistor and the diode. In some embodiments, the power transistor is a bipolar junction transistor (BJT), and a voltage indicating the overpower state of the BJT is produced according to $V_{DESAT}=I_m*R_{prot}+V_D+V_{CE}$, wherein $R_{prot}$ is a resistance of the protection resistor, $V_D$ is a forward voltage of the diode, $I_m$ is the biasing current, and $V_{CE}$ is the switch voltage. In some embodiments, power transistor is a metal-oxide-semiconductor field-effect transistor (MOSFET). In some embodiments, the threshold generation circuit is configured to measure a temperature of at least one of the overpower determination circuit, the diode, and the power transistor, and the threshold generation circuit is further configured to produce the threshold value according to the measured temperature. In some embodiments, the threshold generation circuit is further configured to produce the threshold value according to a combined temperature coefficient of the at least one of the overpower determination circuit, the diode, and the power transistor. In some embodiments, the threshold generation circuit is configured to produce the threshold value according to a maximum current output of the power transistor. In some embodiments, the threshold generation circuit is configured to produce the threshold value according to a maximum power dissipation in the power transistor. In some embodiments, the temperature sensor is on a same semiconductor die as the diode. In some embodiments, the temperature sensor is on a same semiconductor die as the power transistor. In some embodiments, the temperature sensor is on a same semiconductor die as the overpower determination circuit.

In accordance with a preferred embodiment of the present invention, a system includes a power transistor, a detector interface circuit, a temperature sensor and a driver. The detector interface circuit is configured to be coupled to the power transistor. The detector interface circuit is further configured to detect a switch voltage between a source and drain or a collector and emitter of the power transistor. The temperature sensor is configured to measure a temperature of the system. The driver is configured to be coupled to the power transistor, the detector interface circuit, and the temperature sensor. The driver includes a reference generation circuit, and an overpower determination circuit. The reference generation circuit is configured to produce a reference signal according to the measured temperature of the system, and a maximum power dissipation in the power transistor. The overpower determination circuit is configured to compare the detected switch voltage with the produced reference signal. The overpower determination circuit is further configured to determine an overpower state of the power transistor based on the comparison result.

In some embodiments, the temperature sensor is proximate at least one of the overpower determination circuit, a diode in the detector interface circuit, and the power transistor, and the temperature of the system measured by the temperature sensor is a temperature of the at least one of the overpower determination circuit, the diode, and the power transistor. In some embodiments, the reference generation circuit is further configured to produce the reference signal according to a combined temperature coefficient of the at least one of the overpower determination circuit, the diode, and the power transistor. In some embodiments, the reference generation circuit is configured to produce the reference signal according to a maximum current output of the power transistor. In some embodiments, the reference generation circuit is configured to produce the reference signal according to a maximum power dissipation in the power transistor. In some embodiments, the system further includes a control circuit. The control circuit is configured to disable the power transistor in response to the overpower determination circuit determining an overpower state of the power transistor. In some embodiments, the control circuit is further configured to notify another system in response to being notified by the overpower determination circuit.

In accordance with a preferred embodiment of the present invention, a method includes receiving one or more values of a temperature of a system comprising a power transistor from a temperature sensor. The method further includes producing a desaturation threshold according to the received one or more values of the temperature of the system. The method further includes comparing a collector-emitter or source-drain voltage of the power transistor to the produced desaturation threshold. The method further includes disabling the power transistor in response to the collector-emitter or source-drain voltage exceeding the desaturation threshold.

In some embodiments, the method further includes notifying a system in response to disabling the power transistor. In some embodiments, producing the desaturation threshold according to the one or more values of the temperature of the system includes accessing correction coefficients, and producing the desaturation threshold according to the correction coefficients and the one or more received values of the temperature of the system.

Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
   a threshold generation circuit configured to produce a threshold value based on an output of a temperature sensor and a maximum power dissipation in a power transistor;
   a detector interface circuit comprising a protection resistor and a diode coupled to the power transistor, the protection resistor and the diode being coupled in series;
   an overpower determination circuit configured to determine an overpower state of the power transistor based on the threshold value and a switch voltage detected between a source and a drain or a collector and an emitter of the power transistor, and to disable the power transistor in response to the switch voltage exceeding the threshold value, wherein the overpower determination circuit comprises a comparator and the temperature sensor, the comparator having a first terminal coupled to the detector interface circuit, the comparator being configured to measure the switch voltage with the detector interface circuit and compare the switch voltage to the threshold value; and a protection transistor coupled to the first terminal of the comparator, wherein the overpower determination circuit is further configured to enable the protection transistor when the power transistor is disabled, wherein enabling the protection transistor clamps the first terminal of the comparator to ground, wherein the temperature sensor is on a same semiconductor die as the overpower determination circuit such that the temperature sensor is configured to directly measure a junction temperature of the overpower determination circuit, to indirectly measure an ambient temperature of the diode, and to indirectly measure an ambient temperature of the power transistor.

2. The device of claim 1, further comprising:
memory configured to store coefficients relating the threshold value with the output of the temperature sensor, the threshold generation circuit further configured to adjust the threshold value based on the coefficients stored in the memory.

3. The device of claim 1, wherein the overpower determination circuit further comprises:
a current source configured to provide a biasing current through the protection resistor and the diode.

4. The device of claim 3, wherein the power transistor is a bipolar junction transistor (BJT), and a voltage indicating the overpower state of the BJT is produced according to:

$$V_{DESAT} = I_m * R_{prot} + V_D + V_{CE},$$

wherein $R_{prot}$ is a resistance of the protection resistor, $V_D$ is a forward voltage of the diode, $I_m$ is the biasing current, and $V_{CE}$ is the switch voltage.

5. The device of claim 1, wherein the power transistor is a metal-oxide-semiconductor field-effect transistor (MOSFET).

6. The device of claim 1, wherein the temperature sensor is one of a plurality of temperature sensors configured to measure a temperature of the overpower determination circuit, the diode, and the power transistor, and the threshold generation circuit is further configured to produce the threshold value according to each of the measured temperatures.

7. The device of claim 6, wherein the threshold generation circuit is further configured to produce the threshold value according to a combined temperature coefficient of the overpower determination circuit, the diode, and the power transistor.

8. A system comprising:
a power transistor;
a detector interface circuit configured to be coupled to the power transistor, and to detect a switch voltage between a source and drain or a collector and emitter of the power transistor, wherein the detector interface circuit comprises a protection resistor and a diode coupled to the power transistor, the protection resistor and the diode being coupled in series;
a driver configured to be coupled to the power transistor and the detector interface circuit, the driver comprising:
a control circuit;
a level shifter configured to provide a drive signal to the power transistor;
a temperature sensor configured to directly measure junction temperatures of devices in the driver, to indirectly measure an ambient temperature of the diode, and to indirectly measure an ambient temperature of the power transistor;
a reference generation circuit configured to produce a reference signal according to the measured ambient temperature of the power transistor, the measured ambient temperature of the diode, the measured junction temperatures of the driver, and a maximum power dissipation in the power transistor; and
an overpower determination circuit comprising a comparator having a first terminal coupled to the detector interface circuit, wherein the comparator is configured to measure the switch voltage with the detector interface circuit, to compare the switch voltage with the produced reference signal, and to determine an overpower state of the power transistor based on the comparison result, wherein each of the devices in the driver is on a same semiconductor die; and
a protection transistor coupled to the first terminal of the comparator and to a ground terminal,
wherein the control circuit is configured to disable the power transistor in response to the overpower determination circuit determining an overpower state of the power transistor, and to enable the protection transistor when the power transistor is disabled, wherein enabling the protection transistor clamps the first terminal of the comparator to the ground terminal.

9. The system of claim 8, wherein the temperature sensor is one of a plurality of temperature sensors proximate the overpower determination circuit in the driver, the diode in the detector interface circuit, and the power transistor.

10. The system of claim 9, wherein the reference generation circuit is further configured to produce the reference signal according to a combined temperature coefficient of the overpower determination circuit, the diode, and the power transistor.

11. The system of claim 8, wherein the control circuit is further configured to notify another system in response to being notified by the overpower determination circuit.

12. A method comprising:
receiving one or more values of a temperature of a system from a temperature sensor, the system comprising a power transistor, a gate driver for the power transistor, and the temperature sensor, wherein the temperature sensor is disposed in the gate driver such that the temperature sensor is configured to directly measure a junction temperature of the gate driver, and to indirectly measure an ambient temperature of the power transistor;
producing a desaturation threshold according to the received one or more values of the temperature of the system;
measuring a collector-emitter or source-drain voltage of the power transistor with a detector interface circuit, wherein the detector interface circuit comprises a protection resistor and a diode coupled to the power transistor, the protection resistor and the diode being coupled in series;
comparing the collector-emitter or source-drain voltage of the power transistor to the produced desaturation threshold with a comparator, wherein the comparator has a first terminal coupled to the detector interface circuit;

disabling the power transistor in response to the collector-emitter or source-drain voltage exceeding the desaturation threshold; and clamping the first terminal of the comparator to ground when the power transistor is disabled.

13. The method of claim 12, further comprising:

notifying the system in response to disabling the power transistor.

14. The method of claim 12, wherein producing the desaturation threshold according to the one or more values of the temperature of the system comprises:

accessing correction coefficients; and producing the desaturation threshold according to the correction coefficients and the one or more received values of the temperature of the system.

15. The method of claim 12, wherein clamping the first terminal to ground comprises enabling a protection transistor, the protection transistor being coupled to ground and to the first terminal of the comparator.

* * * * *